United States Patent [19]

Ziemba

[11] 4,217,147

[45] Aug. 12, 1980

[54] FACILITY FOR GENERATING TECHNICALLY USEABLE ENERGY BY CONVERSION OF SOLAR ENERGY

[76] Inventor: Georg Ziemba, Langenäckerstr. 29, 7462 Frommern, Fed. Rep. of Germany

[21] Appl. No.: 971,920

[22] Filed: Dec. 21, 1978

Related U.S. Application Data

[62] Division of Ser. No. 800,571, May 25, 1977.

[30] Foreign Application Priority Data

Jun. 2, 1976 [DE] Fed. Rep. of Germany ....... 2624672

[51] Int. Cl.² .......................... H01L 31/04; F24J 3/02
[52] U.S. Cl. ........................... 136/89 HY; 136/89 PC
[58] Field of Search .................... 136/89 PC, 89 HY; 126/270, 271, 438, 424

[56] References Cited

U.S. PATENT DOCUMENTS 4,030,477  6/1977  Smith ................................ 126/270

FOREIGN PATENT DOCUMENTS 635283  3/1928  France ....................... 126/271

Primary Examiner—Aaron Weisstuch
Attorney, Agent, or Firm—Kenyon & Kenyon

[57] ABSTRACT

A facility for generating technically useable energy by converting solar energy in which a single large concave mirror is disposed in a depression in the ground and has supported thereabove a supporting structure, on a support arm of which an elongated energy collector is provided extending from the theoretical focal point for rays on the axis to the periphery of the spherical mirror, said supporting structure supporting the energy collector for rotation about the center of the mirror to follow the changing position of the sun. Also disclosed is a method for making such a mirror.

28 Claims, 10 Drawing Figures

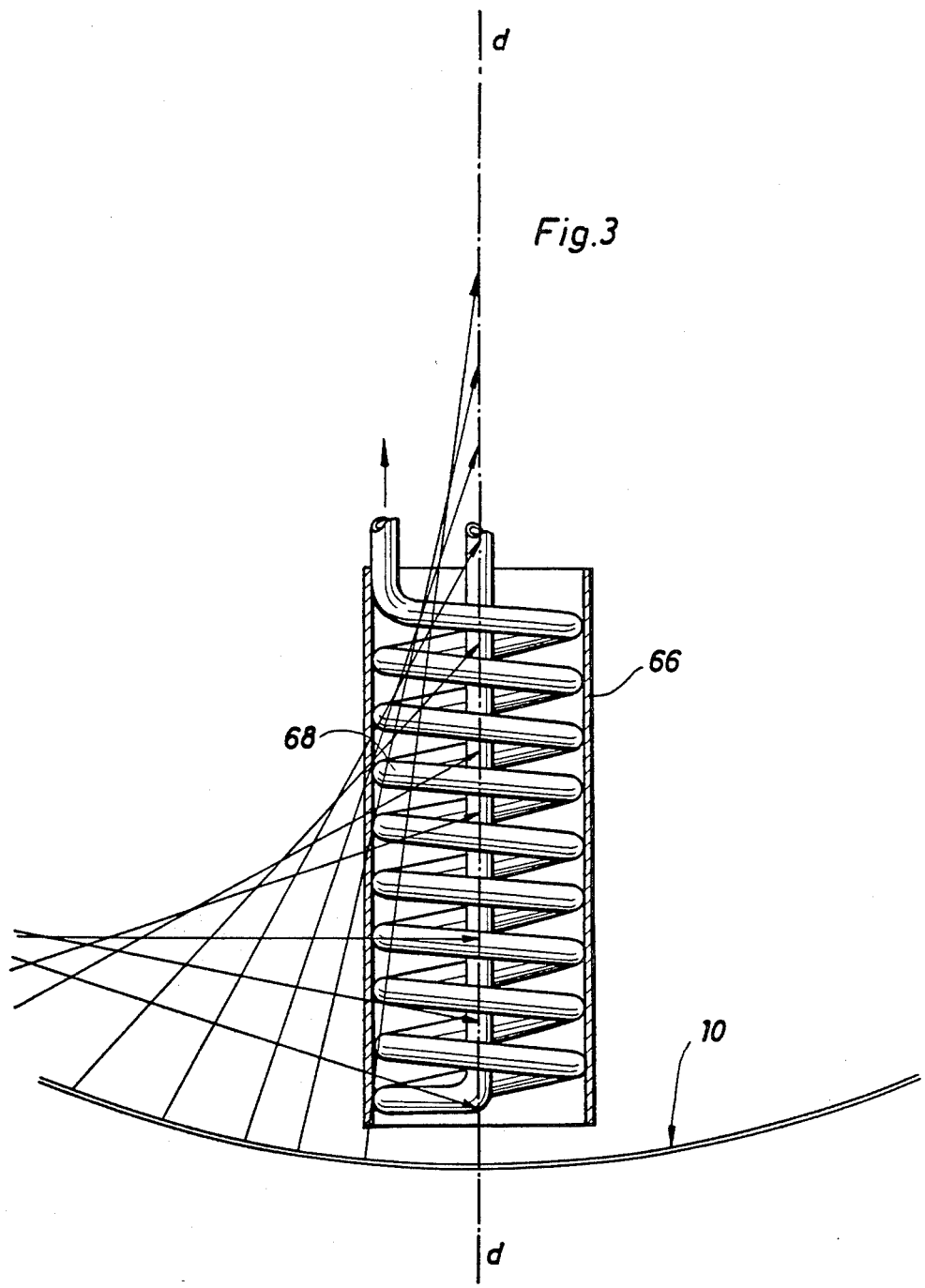

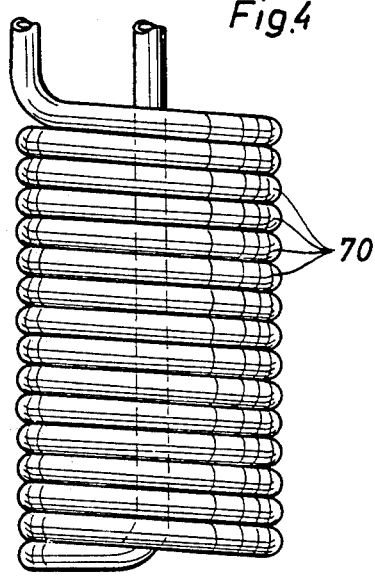
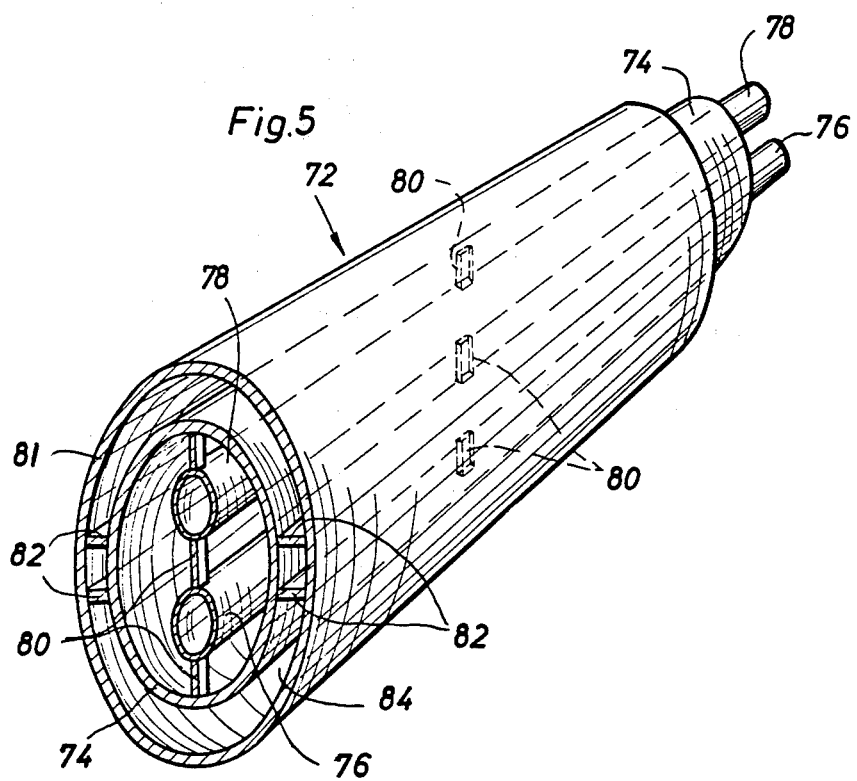

FACILITY FOR GENERATING TECHNICALLY USEABLE ENERGY BY CONVERSION OF SOLAR ENERGY

This is a division of application Ser. No. 800,571 filed May 25, 1977.

BACKGROUND OF THE INVENTION

This invention relates to energy in general and more particularly to an improved facility for generating useable energy by conversion of solar energy.

Installations comprising at least one concave mirror and at least one energy collector, by which reflected sun rays can be intercepted and converted into technically useable energy which can be supplied to at least one consumer are known.

In the conversion of solar energy into technically useable energy, the main problem is the low energy density of solar radiation. It necessitates very large intercept surfaces. To solve this problem, there is in preparation by the German Fraunhofer-Gesellschaft, according to newspaper reports, a facility which includes a multiplicity of concave mirrors of, for instance, 4 meters diameter, in which the solar energy is to be collected and fed with low losses to a power plant center. This project, as well as other apparatus of this type which are equipped with batteries of plane mirrors, can be technically realized only at great cost, however, because the concave mirrors must be made to follow the sun's position. The main disadvantage of these plants, however, is the large number (thousands) of relatively small concave mirrors required, which necessitates an equal number of small miniature power plants (at every mirror focus). The energy of several square meters, while focussed, is nevertheless distributed over a large area. The cleaning, repairing and adjusting of the concave mirrors would, in addition, make the plant uneconomical.

SUMMARY OF THE INVENTION

It is an object of the present invention to provide a faciltiy of the type mentioned at the outset, by means of which solar energy incident on large surfaces can be collected economically and converted into technically useable energy, which has a high efficiency, is not trouble prone and can be cleaned and maintained economically and conveniently.

According to the present invention, this problem is solved by using a single spherical mirror for focussing the solar radiation and by bringing the energy collector to the theoretical focal point of the spherical mirror for rays near the axis and extending the collector along the optical axis in a direction toward the circumference of the spherical mirror. The collector is disposed for movement relative to the mirror about an axis going through the center of the spherical mirror in accordance with the changing position of the sun.

With this arrangement, the entire solar energy striking the mirror can be intercepted because the energy collector is not only brought into the theoretical focus of the spherical mirror for rays near the axis, but, starting from this focus, is extended along the axis in a direction toward the circumference of the spherical mirror. Thereby, the ray reflection at the spherical concave mirror according to the laws of nature is utilized in that all rays intersect the axis between the theoretical focus for rays near the axis and the spherical mirror, and this is sufficient to intercept the energy there. Optical focussing is thus not necessary with the arrangement according to the present invention. The present invention is thus based on the insight that a spherical concave mirror in conjunction with an energy collector disposed in a special arrangment acts to collect all solar energy striking the mirror. In this connection, it is essential that the spherical concave mirror, due to its spherical shape which is not distinguished by an axis in space, can be stationary, which means a substantial technical simplification, since it becomes possible thereby to use spherical mirrors with, for instance, a diameter of several hundred meters and to thereby realize the conversion of solar energy on a large scale.

It should be noted in this connection that, heretofore, spherical mirrors have been considered as unsuitable for generating technically useable energy from solar radiation, since they do not have a focal point like parabolic mirrors. At best, it was used as a technically cheaper approximation for a parabolic mirror for rays near the axis. In contrast thereto, the entire solar energy striking the spherical concave mirror can theoretically be intercepted with the design according to the present invention if, in one possible embodiment of the invention, the energy collector is designed as a rod shaped or cylindrically shaped body of rotational symmetry and extends all the way to the periphery of the spherical mirror.

In smaller installations, the energy can be converted via high-performance solar cells which can be mounted on the outside surface of the energy collector. An advantageous design is obtained if annular zones, placed on top of each other as seen in the axial direction, are provided at the circumference of the energy collector, the zones having solar cells at their circumference for converting energy into d-c current, the peripheral surface of these annular zones defined by the solar cells being of conical shape in such a manner that the reflected solar radiation from any point of the spherical mirror strikes the solar cells perpendicularly. The d-c current obtained can be fed via a cable to the consumer, for instance, a power station. Advantageously, the energy collector will be cooled, for which purpose cooling coils can be arranged throughout its interior in order to absorb the waste heat. Depending on the size and economic considerations, the d-c line can be made superconducting by cooling it with liquid hydrogen and sufficient heat shielding. It is likewise possible to use the energy collector to convert the solar radiation into thermal energy if the surface of the collector is formed of optimally blackened sheet metal. Copper or silver sheet is particularly well suited for this purpose; the heat transfer can be accomplished by means of a heat convection medium which is conducted in tube coils arranged inside the enclosure. The surface of the energy collector can also be formed by a helical tube, in which the heat convection medium is conducted. In this case, too, the tube helix will be made of blackened tubes; in general, coating with carbon black or platinum sponge is advantageous for the surface, which ensure 97% absorption of the solar radiation. As the heat transport or cooling medium, sodium is particularly well suited because of its low solidification point, its high boiling point and its low specific gravity.

The energy transport line connecting the energy collector to the consumer must be well heat insulated. This can advantageously be accomplished by means of an internally mirror coated, evacuated, flexible pipeline, in which the lines carrying the heat transport medium, particularly sodium, are arranged. These may be connected to a counterflow heat exchanger. In that case, the liquid sodium gives off its energy in the counterflow heat exchanger to water, which can be used for operating a turbine, particularly a counter-flow turbine.

In some cases, additional cooling of the collector surface may be required, and this can be accomplished advantageously if the energy collector has a double jacket in which cooling water circulates.

In one embodiment of the present invention, the energy collector is arranged on a vertical beam which is disposed along a diameter of the spherical mirror, such that it can be swung about the center of the spherical mirror as well as moved in the vertical direction, where either the beam itself can be rotatable about its longitudinal axis or the energy collector may be tiltable relative to the beam by means of a suitable driving device, in order to position the collector according to the changing position of the sun. If spherical mirrors with a diameter of about 70 to 150 mm are involved, it is advantageous to arrange the beam at a support frame which comprises several frame girders which are supported in the vicinity of the rim of the spherical mirror and are firmly connected to each other at a distance above the center of the spherical mirror, for instance, designed in the manner of lattice masts and at which the beam carrying the energy collector is arranged vertically hanging down and rotatable about its longitudinal axis. If, on the other hand, spherical mirrors with a diameter of about 150 to 180 m are involved, then the beam will advantageously be designed as a vertical tower structure, the longitudinal axis of which goes through the center of the spherical mirror and the height of which is larger than the radius of the spherical mirror. In the case of vertical incidence of the light, the tower structure itself is on the optical axis and must be equipped exactly like the energy collector.

If facilities are to be built, in which the diameter of the spherical mirror is more than 180 m for instance, between 180 and 400 m, then it will be advantageous to arrange the tower structure inside the spherical mirror disposed in such a manner that it is radially movably along a horizontal track, whereby the support arm carrying the energy collector can be made relatively short. In this connection, it is advantageous to suspend the energy collector from adjustable cables on the support arm. Such cables allow a particularly advantageous adjustment of the energy collector.

In another advantageous embodiment of the invention, at least two further support arms which can be swung in the vertical direction, are provided at the support structure. All the support arms are advantageously arranged at approximately equal angular spacings from each other. Such additional support arms serve, for one, for balancing the weight of the support arm carrying the energy collector, and furthermore, they can each be equipped with a working head for fabricating and cleaning the spherical mirror. These support arms can be swung in the vertical plane, for instance, by means of cables. The cable winches may be placed at the base of the tower structure or at the base of each frame girder. Using at least one working head arranged at the support frame, it is possible to form the spherical shape of the spherical concave mirror if the support frame or, also, only the support arms exacute corresponding pendulum movements about a vertical axis, where the movements need to be executed within a tilt angle of only maximally 180° to 190°, so that the working head can be brought to every point of the hemispherical recess used for making the concave mirror. This pendulum motion is also sufficient to move the energy collector, after the spherical concave mirror is completed, in accordance with the position of the sun, which must be swung for this purpose maximally 180° in the course of a day. Such pendulum movements have the advantage over continuous rotation of the support frame that complicated rotational couplings are obviated. The support arms are advantageously driven by propulsion jets which are capable of accelerating and decelerating the support frame or the support arms. Thus, the entire installation contains no heavy drive motors and all movements can be executed via a valve control system, for instance, for a compressor, using computers under electronic control. Measuring feelers on the support arms and the support frame may monitor the movements and allow fully automatic operation, so that in the fabrication of the spherical mirror, no operation need to caried out by hand or by ground-based machines.

For making the wall of the spherical mirror, the support structure with the support arms carrying the working heads is first erected over a suitable, preliminary depression. All other operations for making the mirror surface can be carried out by means of the support arms and the working heads. Particularly if the subsoil is sandy, the soil must first be fortified, which can be done by spraying with a glue-like substance or, for instance, with spraying concrete, installing a wire screen, if necessary. After a fortified layer is finished with a thickness of about 1 to 2 cm, the consistency of the layer can gradually be changed e.g. it can be made thicker. It should become progressively more porous and accordingly contain admixtures of foam material such a polyurethane or polyurethane-like synthetics. Onto the transition layer so produced, a light, firm but elastic foam layer is sprayed. If the depression has a good spherical shape, this layer, for instance, in the case of desert sand, can be relatively thin, particularly at the bottom of the sphere. However, rock crevices or whole ditches and trenches can be also foamed, so that the spherical shape of the depression in the soil can be quite "flat" and need be adhered to only roughly. Toward the edge, the foam layer will be made thicker, so that finally, a thick bead for the rim of the mirror is generated. Depending on the requirements, this layer may have a thickness from several decimeters to several meters. After the plasticized foam layer has cooled down, the latter must be pressed into the desired spherical shape, whereupon a smooth, relatively hard surface crust will be formed as a further layer, upon which, finally, the finished mirror layer can be cemented. In order to facilitate the application of the individual layers in an advantageous manner, the length of the support arms is advantageously variable, and in addition, the working heads are disposed adjustably at the support arms in order to equalize initial unevennesses, to set the necessary operating distances and to generate the necessary operating pressures. This can be done hydraulically. For the final shaping of the surface of the spherical mirror, at least the one working head is equipped with an accordingly curved pressure plate which can preferably be heated and may optionally contain nozzles for spraying steam or suitable solvents in order to plasticize the mentioned foam layer for shaping. The working head will advantageously be further equipped with at least one nozzle for applying foam material. The shaping of the spherical mirror wall is accomplished by pressing the pressure plate into the foam and subsequently lifting it off again, to be pressed into the foam again after having been moved-on accordingly. According to the present invention, the metallic mirror layer is also applied automatically, for which purpose the one working head comprises a reservoir, from which a substrate foil carrying the mirror layer can be pulled and applied to the wall of the spherical mirror. In a preferred embodiment, a supply roll is replaceably arranged in the reservoir, on which the substrate foil is placed, and in addition, the working head is equipped with at least one glue applicator, by means of which the substrate foil can be coated with glue before being applied to the wall of the spherical mirror. When the substrate layer is pulled off the supply roll, the substrate material carrying the metallic mirror layer is first coated with glue, before it is applied, free of bubbles, to the pre-shaped plastic layer by rolling with a pressure roller or by means of a sliding cushion on the working head. If several working heads are used, e.g., in the construction phase, these can each be specialized for one operation (foaming, shaping, mirror application). The working head for repairing the mirror, however, is not specialized; it preferably contains a pressure plate which can be swung out of the way upward (shaping) as well as nozzles (which can be run into place selectably) for foaming, and fixtures for applying the mirror surface. The working head of the one support arm is advantageously equipped with a cleaning device for cleaning the surface of the mirror surface of the spherical mirror, which may have a brushing, polishing and/or suction function.

The mirror layer will be applied to the substrate material by an industrial process, for instance, by vapor deposition on the substrate foil and subsequent sealing through the application of a suitable, fast-drying, non light absorbing lacquer. Zinc and magnesium are particularly well suited as evaporation metals, as they are cheap on the one hand, and one can work, on the other hand, with high evaporation rates (particularly in the case of zinc). In addition, zinc is distinguished by particularly high reflectivity for light also in the visible region, for which reason it is the ideal mirror metal.

In small installations, the previously mentioned three support arms will be sufficient. The support arms carrying the working heads can be mounted at the support structure or its girders in such a manner that they can be swung horizontally about 20° to 30°, if balancing weights are provided at both support arms movably arranged along their length, in order to keep the center of gravity always approximately in the same position. This makes it possible to perform cleaning or repair work in the spherical mirror even during daytime operation.

BRIEF DESCRIPTION OF THE DRAWINGS

FIG. 1a is a top view of the facility according to FIG. 1, on a reduced scale.

FIG. 3 is a longitudinal cross section through a second embodiment of an energy collector for converting the solar energy into thermal energy.

FIG. 4 is a side view of an energy collector, shown shortened, for converting the solar energy into thermal energy as a design variant of FIG. 3.

FIG. 5 is a perspective view of a portion of a heat conduit connected to the energy collector according to FIG. 3 or 4.

DETAILED DESCRIPTION OF THE INVENTION

Figure 1:
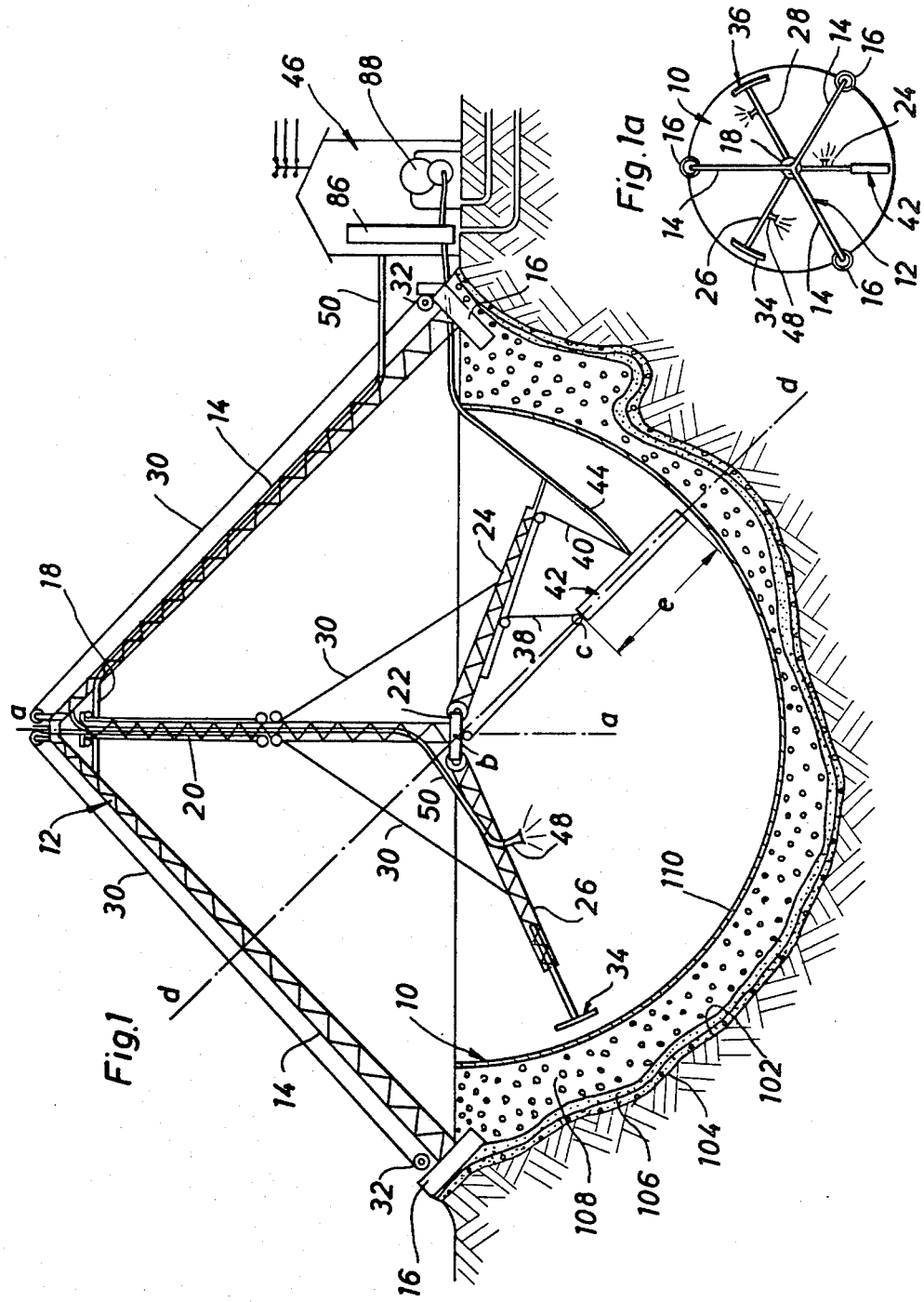
FIG. 1 is a longitudinal cross section of a first embodiment of a facility according the present invention.

In the facility shown in FIG. 1, a spherical mirror having a metallic mirror layer is designated generally by 10. The mirror 10 is recessed in the soil. Above the spherical mirror a support structure 12, which consists, for instance, of three frame girders 14 which are arranged in star fashion relative to each other is located. These may be designed, for instance, as lattice masts. Only two of the frame girders 14 are visible in FIG. 1. These frame girders 14 are supported on one side on abutment plates 16 sunk into the soil in the rim region of the spherical mirror 10 and are firmly connected to each other at their other, upper end. In the vicinity of their upper end, and frame girders support a stationary horizontal platform 18, at which a rigid beam 20, hanging downward, is held, rotatable about its longitudinal axis. This beam is arranged in such a manner that its lengthwise or rotational axis a-a passes through the center of the spherical mirror 10. A horizontal mounting plate 22 is rigidly arranged at the lower end of the beam. Three support arms 24, 26, 28 are mounted to the plate so that they can be swung vertically at equal angular spacing, for instance. The support arms can be swung in the vertical direction using cables 30 driven by winches 32 which are attached at the base of each frame girder. While working heads 34 and 36 are arranged on the support arms 26, 28, a rod shaped energy collector is suspended from beneath the support arm 24 by means of adjustable cables 38 and 40. The one end of the collector 42 is located at the theoretical focal point c of the spherical mirror 10 for rays near the axis and extends from there along the optical axis d-d to the periphery of the spherical mirror. All the sun rays incident on the spherical mirror 10 are reflected so that they intersect the section e of the optical axis d—d. In this region, the solar energy is intercepted by means of the energy collector 42. Optical focussing is not necessary. In the energy collector 42, the intercepted solar radiation is converted either into electric or thermal energy and fed to a power station 46 via transmission line 44 which is connected to the former and held by the support arm 24. By means of the cables 38 and 40, the energy collector can be exactly aligned with the optical axis d—d of the spherical mirror. The support arm 24, 26 and 28 including the beam 20 can be rotated about the axis a—a in accordance with the change in the sun's position, the drive being accomplished preferably by propulsion jets 48 (see FIG. 1a), from which compressed air is ejected. The jets are connected via compressed air tubes 50 to a compressor plant. Such a jet 48 is indicated in FIG. 1 at the support arm 26. In reality it is mounted at the support arm 26 rotated 90° from the position shown: it is shown in the position in FIG. 1 merely because of the more easily understood presentation.

Figure 8:
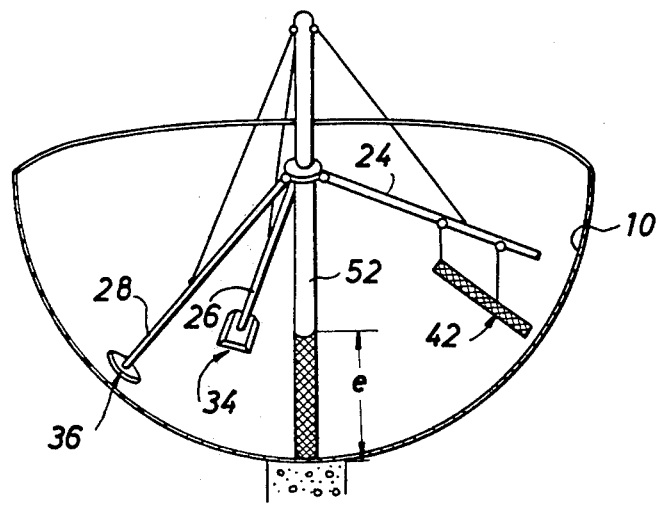
FIGS. 8 and 9 schematically illustrate design variants of the support structure.
Figure 9:
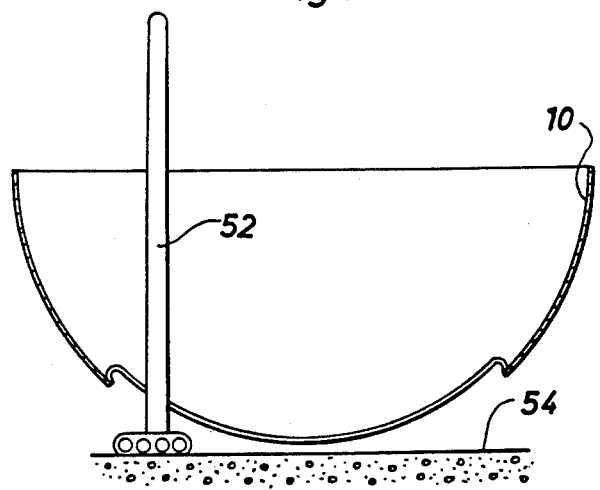

The design shown in FIG. 1 is suited, for instance, for spherical mirrors with a diameter of about 70 to 150 m. For larger diameters, for instance, for spherical mirrors of 150 to 180 m diameter, the support structure in the embodiment shown in FIG. 8 is suitable, which in this case forms a support column 52. In this case, it should be noted that this support column is itself located in the section e of the optical axis of the spherical mirror when the light incidence is vertical, and in this region the support column itself must take over the function of the energy collector and must be equipped accordingly. In the case of spherical mirrors of about 180 to 400 m diameter, on the other hand, it is advantageous if the support column 52 be moved radially according to FIG. 9 along a radial track 54. This results in the advantage that the support arms, which were not drawn in FIG. 9 for the sake of simplification, can be made relatively short. In this connection, it should further be mentioned that the support arms supply mutual counterweights, so that no substantial mast overhang can occur.

Figure 2:
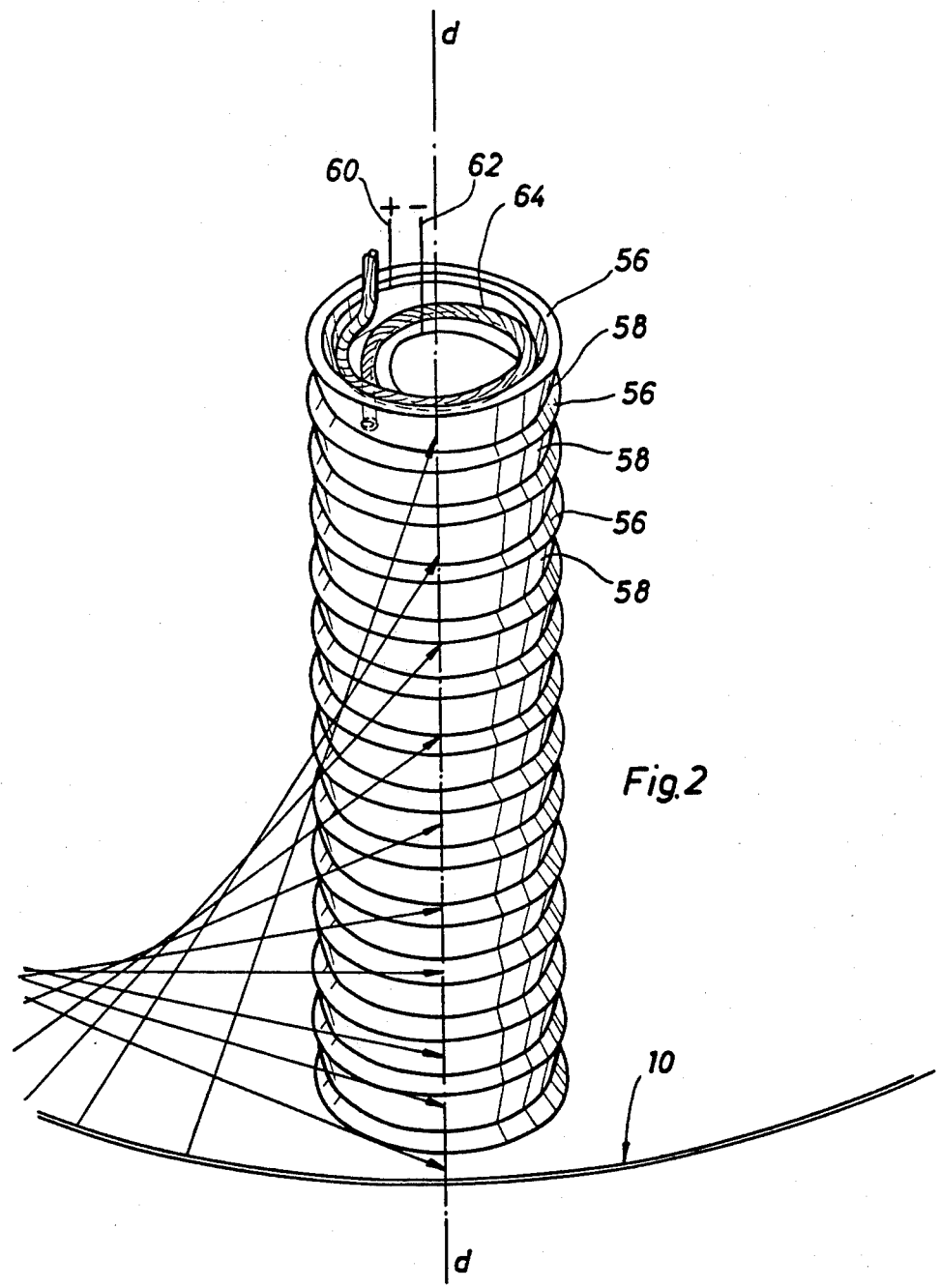
FIG. 2 is a perspective view of a first embodiment of a possible energy collector which is used for converting the solar radiation into electric energy.

It will be assumed that the solar radiation intercepted by means of the energy collector is to be converted into electric energy. For this purpose, a preferred embodiment of the energy collector has coaxially related, as seen in its axial direction, ring bodies which have conical shape at the periphery. The ring bodies are all tapered in the same direction as seen from the theoretical focal point for rays near the axis, until the reflected light of a given ring zone of the mirror strikes the energy collector perpendicularly. From there on, the rings become wider in the same direction, i.e., downward according to FIG. 2. The outside circumference of these ring bodies is occupied by solar cells 58. The conicity of the ring zones is chosen so that in the arrangement of the energy collector on the optical axis of the spherical mirror, the reflected sun rays strike the solar cells perpendicularly, as indicated in FIG. 2. Within the surface formed by the ring bodies 56, there are electrodes 60, 62 and a cooling coil 64 which absorbs the waste heat. The electric cable connected to the electrodes, together with the cooling line connected to the cooling coil 64, can be accommodated in a line system which leads to the power station house.

FIGS. 3 and 4 show possible designs of the energy collector for converting the solar radiation into thermal energy. In the embodiment according to FIG. 3, the energy collector has a hollow cylindrical shell 66 of copper or silver sheet which is blackened on its outer periphery optimally by means of carbon black or platinum sponge. Inside this shell, a tube coil 68 is mounted which is connected to the shell in a thermally conducting manner and in which a heat transport medium, e.g., sodium, is conducted. According to FIG. 4, the shell may also be formed by a tube coil, the turns 70 of which lie close together. In this case, this tube coil is suitably blackened at its periphery. The energy collector constructed in accordance with FIGS. 3 and 4 is connected to the power station house 46 via an energy line 72 shown in FIG. 5. The latter shows a flexible pipeline, mirror coated on its inside 74, in which two lines 76 and 78 are secured which carry in particular sodium and which are held by means of spacers 80 at a radial spacing from the inner circumference of the evacuated pipeline. The evacuated pipeline 74 is surrounded at a radial spacing by a further jacket 81, which is centered by spacers 82 with respect to the evacuated pipeline 74, and cooling water is carried in the annular channel 84 formed thereby. The liquid sodium carried in the pipelines 76 and 78 delivers the absorbed thermal energy to a counterflow heat exchanger 86 at the power station house 46, the water of which drives a turbine 88 (FIG. 1).

Figure 6:
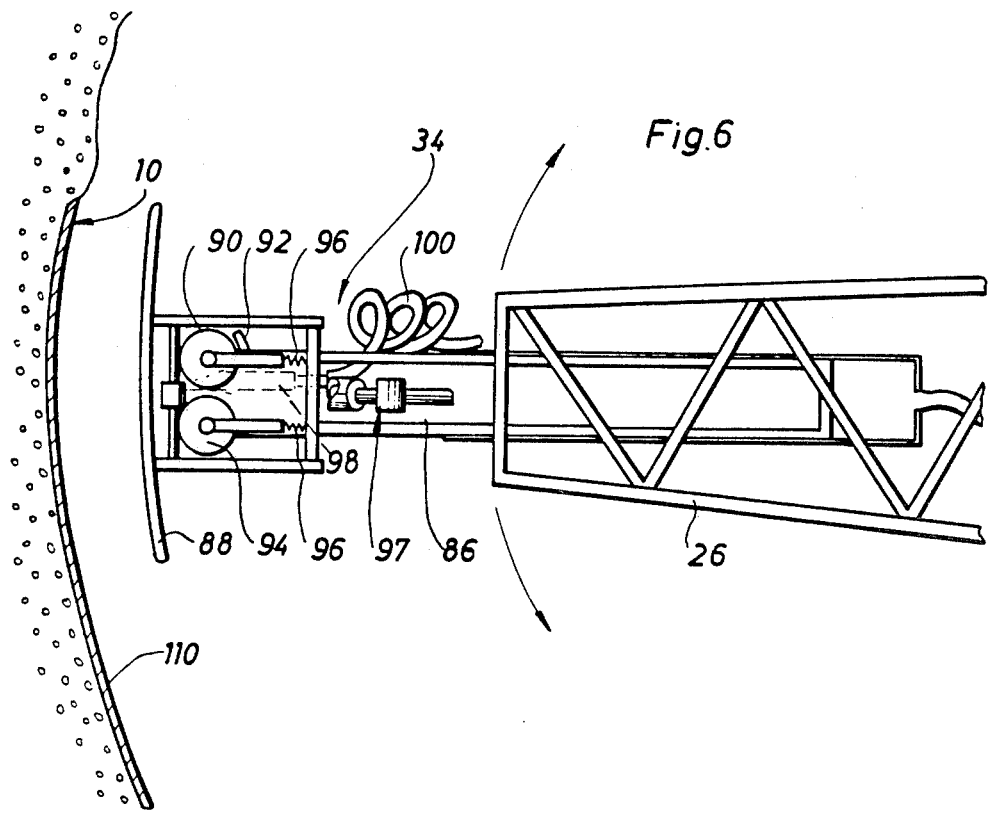
FIG. 6 is a top view onto the front end of a support arm equipped with a first embodiment of a working head, with the pressure plate swung forward.
Figure 7:
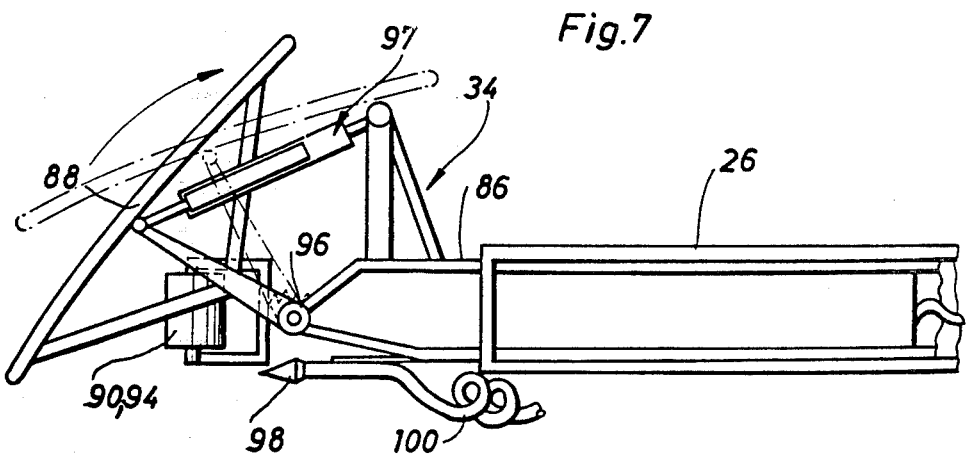
FIG. 7 is a side view of the equipment according to FIG. 6 with the pressure plate swung up.

As already described above, the support arms 26 and 28 associated with the support arm 24 each carry a working head, 34 and 36 respectively, for the purpose of preparing the spherical mirror. In FIGS. 6 and 7, a universal working head 34 is shown, such as can be used for repair work. The latter has a pressure plate 88 which is of convex shape, at least on its outside, according to the curvature of the concave mirror, disposed at the end of a support rod 86. Rod 86 can be extended in the radial direction in telescope fashion and is controlled, for instance, hydraulically. Nozzles which spray steam or solvent (not shown here) may be set into the pressure plate. The pressure plate can be swung up by means of the hydraulic system 97 (see FIG. 7). Behind the pressure plate, a supply roll 90 is mounted, on which a support or substrate foil carrying the metallic mirror layer of the spherical mirror is wound. A glue applicator 92, by means of which a glue film can be applied to the backside of the support foil is disposed adjacent to the supply roll 90. Also provided is a pressure roller 94, by means of which the support foil 110 pulled off from the supply roll, can be pressed against the wall of the spherical mirror. The two rolls 90 and 94 are adjustable against the action of compression springs 96, so that they are pressed resiliently against the wall of the spherical mirror and can roll off in the process while the working arm travels in the direction of the arrow. A nozzle 98, by means of which a medium that is supplied via a hose 100 can be applied is also installed. Such a medium may be steam, a suitable solvent and/or foam material.

FIG. 7 shows a side view of a working head which can be used at the same time for repairing the spherical mirror. In this embodiment the pressure plate 88 is swung out of the way. The nozzle(s) 98 can be extended in order to avoid dirtying the mirror-coating facility.

The spherical mirror is constructed using the above-described support frame in such a manner that the support frame 12 is erected, according to FIG. 1, above a depression which may be natural or may be prepared by bulldozers, baggers or by blasting in such a manner that its support arms 26 and 28, which form the working arms, rotate in the center b of the future spherical mirror. After the support frame is erected, the working heads 34 and 36 then take over all further operations for the making of the spherical mirror. First, however, the surface 102 of the depression, or the soil, is fortified. This can be done by spraying with glue or by spraying concrete. These fortification operations can be accomplished by the working heads using one or more nozzles 98, which can be steered to any point of the depression, by swinging the support arms vertically or horizontally if they are designed so that they can be varied in length, as mentioned above. When fortifying the spraying concrete, which can further be stiffened by an insert of wire mesh, a first layer 104 (FIG. 1) is thus generated, a thickness of 1 to 2 cm being sufficient. Onto this layer, a further layer 106 which is more porous and should be provided with appropriate admixtures, e.g., a plastic material, is advantageously applied. This second layer 106, to be called transition layer, can be given a thickness of, say, 3 cm, and onto the latter is sprayed a strong but inherently elastic third layer 108 which consists of a suitable plastic foam. If the shape of the depression is good (desert sand), then this layer can be quite thin, particularly in the region of the bottom of the sphere. However, rock crevices and even entire ditches and trenches can be foamed over. Toward the rim, the layer will have to be made thicker of necessity, since the edge zones of the other layers deviate from the spherical shape considerably, so that a relatively thick rim bead for the edge of the mirror is generated. In the upper region, this layer can reach a thickness of several meters. The foam material used for forming this layer is applied hot from the nozzles 98 of the working heads and is subsequently pressed, after having cooled down, into the desired spherical shape by means of the pressure plate 88, in the process of which the surface of this layer will solidify and form a thin, smooth relatively hard surface crust. Onto this layer, the finished mirror layer is then applied, by pulling the mentioned support foil 110 from the supply roll 90; glue is applied to the foil at the same time and the foil is pressed onto the preformed surface of the previously applied layer 108 by means of the roll 94. At least after the spherical mirror is finished, one of the working heads will be provided as a cleaning device, so that the surface of the spherical mirror can also be cleaned by suction and brushing easily and gently.

It would seem that foam material is particularly well suited as the wall material because of its light weight. The light weight of the foam material in turn makes possible favorable static conditions, since the wall of the mirror can be terminated at the rim with a thick foam material bead, whereby earth movements and fortification of the soil present no major problems, since no steep slopes must be worked into the soil.

What is claimed is:

1. In a facility for generating technically useable energy by converting solar energy comprising at least one concave mirror and at least one energy collector, by which reflected sun rays can be intercepted and converted into technically useable energy, the improvement comprising:
   (a) the mirror being a stationary spherical mirror for focusing the solar radiation;
   (b) means supporting the energy collector such that it is brought to the theoretical focal point of the spherical mirror along its optical axis;
   (c) said energy collector extending along the optical axis in a direction toward the circumference of the spherical mirror and having annular zones stacked on top of each other as seen in the direction of the axis at the periphery of the energy collector, each zone having solar cells disposed at its circumference for energy conversion into d-c current, the peripheral surface of said annular zones defined by the solar cells being of conical shape in such a manner that the solar radiation reflected from any point of the concave mirror strikes the solar cells substantially perpendicularly;
   (d) means for moving said energy collector relative to the spherical mirror about an axis going through the center of the latter to follow the changing position of the sun; and
   (e) means for cooling said energy collector.

2. The improvement according to claim 1, wherein the energy collector is cylindrically shaped body of rotational symmetry and wherein said body extends up to the periphery of the spherical mirror.

3. The improvement according to claim 2, wherein said means for cooling comprise at least one cooling coil passing through the interior of the energy collector for cooling.

4. The improvement according to claim 3, and further including a d-c line connecting said energy collector to an energy consumer, said line being constructed to also act as a line for a cooling medium which can be fed to the energy collector.

5. The improvement according to claim 4, wherein said cooling medium is liquid hydrogen and said d-c line is made superconducting.

6. The improvement according to claim 2, wherein said energy collector is adapted to convert the sun rays into thermal energy and wherein the outside surface of said energy collector is optimally blackened.

7. The improvement according to claim 6 wherein said energy collector includes at least one tubular coil in which a heat transport medium is conducted.

8. The improvement according to claim 7 wherein the outside surface of said energy collector is formed of copper or silver sheet and wherein said at least one tubular coil in which a heat transport medium is conducted, is arranged inside said sheet.

9. The improvement according to claim 7 wherein the outside surface of the energy collector is formed by said tubular coil in which a heat transport medium is conducted.

10. The improvement according to claim 9, wherein said tubular coil is formed by blackened tubes which carry a liquid heat transport medium.

11. The improvement according to claim 7 wherein said heat transport medium is sodium.

12. The improvement according to claim 7 and further including an energy transport line connecting the energy collector to an energy consumer, said line comprising an evacuated, flexible pipeline which is mirror coated on the inside and in which lines that carry the heat transport medium are arranged, and a counterflow heat exchanger connected to said lines.

13. The improvement according to claim 12 wherein said evacuated pipeline has a double jacket in which cooling water circulates.

14. In a facility for generating technically useable energy by converting solar energy comprising at least one concave mirror and at least one energy collector, by which reflected sun rays can be intercepted and converted into technically useable energy, the improvement comprising:
   (a) the mirror being a stationary spherical mirror for focusing the solar radiation;
   (b) a vertical beam arranged along a diameter of said spherical mirror so that it can be rotated about the center of the spherical mirror to follow the changing position of the sun;
   (c) a first support arm disposed on said vertical beam supporting the energy collector such that it is brought to the theoretical focal point of the spherical mirror along its optical axis, said first support arm extending from said beam and further including adjustable cables suspending said energy collector from said support arm and permitting movement of said energy collector in the vertical direction;
   (d) said energy collector extending along the optical axis in a direction toward the circumference of said spherical mirror; and (e) at least two additional support arms supported for swinging motion in the vertical direction extending from said beam, said first support arm and additional support arms being arranged approximately at equal angular spacings.

15. The improvement according to claim 14, wherein said spherical mirror has a diameter of about 70 to 150 m and said beam is disposed on a support structure comprising a plurality of frame girders, each having one end abutting a support surface in the region of the rim of the concave mirror, said girders having their outer ends firmly connected to each other at a distance above the center of the concave mirror, said girders being in the form of lattice masts, each beam hanging vertically downward from the point where said girders are connected in such a manner that it can rotate about its longitudinal axis.

16. The improvement according to claim 14, wherein said spherical mirror has a diameter of about 150 to 180 m and wherein said beam comprises a vertical tower structure, the longitudinal axis of which passes approximately through the center of said spherical mirror and the height of which is larger than the radius of the spherical mirror.

17. The improvement according to claim 14, wherein said spherical mirror has a diameter of about 180 to 400 m and wherein said beam comprises a tower structure and means for moving said tower structure radially within the spherical mirror along a horizontal track and wherein said energy collector is arranged on a support arm extending laterally away from said tower structure.

18. The improvement according to claim 14 and further including a working head arranged at each of said further support arms for constructing and cleaning said spherical mirror.

19. The improvement according to claim 18 wherein at least one of said working heads is supported to be movable in the radial direction and wherein the length of the support arms is variable.

20. The improvement according to claim 18 wherein one of said working heads includes a pressure plate with a correspondingly curved outside surface for generating the shape of the spherical mirror.

21. The improvement according to claim 20 and further including means to heat said pressure plate.

22. The improvement according to claim 20 and further including at least one nozzle for dispensing a material selected from the group consisting of foam material, steam, and solvent, disposed at said one working head.

23. The improvement according to claim 18 wherein at least one of said working heads includes a supply of a substrate foil carrying the mirror layer of the spherical mirror and means for pulling said substrate off and applying it to the wall of the spherical mirror.

24. The improvement according to claim 23 wherein said supply comprises an exchangeable supply roll for the substrate foil, held resiliently and a glue application device associated therewith for coating the substrate foil with glue before it is applied to the wall of the spherical mirror.

25. The improvement according to claim 18 wherein a working head is provided including:
(a) a pressure plate with a correspondingly curved outside surface for generating the shape of the spherical mirror;
(b) means to heat said pressure plate;
(c) at least one nozzle for dispensing a material selected from the group consisting of foam material, steam, and solvent, disposed at said one working head; and
(d) a supply of substrate foil carrying the mirror layer of the spherical mirror and means for pulling said substrate off and applying it to the wall of the spherical mirror.

26. The improvement according to claim 18 wherein one of said support arms has thereon a cleaning device for cleaning the surface of the mirror layer of the spherical mirror.

27. The improvement according to claim 18 including balancing weights on each support arm carrying two working heads, said weights arranged so that they can be moved and locked along their longitudinal dimension.

28. The improvement according to claim 14 and further including propulsion jets for rotating said beam including said support arms in both directions.

* * * * *